United States Patent
Åberg et al.

(10) Patent No.: US 9,012,883 B2
(45) Date of Patent: Apr. 21, 2015

(54) RECESSED CONTACT TO SEMICONDUCTOR NANOWIRES

(71) Applicant: Sol Voltaics AB, Lund (SE)

(72) Inventors: Ingvar Åberg, Lund (SE); Martin Magnusson, Malmö (SE); Damir Asoli, Malmö (SE); Lars Ivar Samuelson, Malmö (SE); Jonas Ohlsson, Malmö (SE)

(73) Assignee: Sol Voltaics AB, Lund (SE)

( * ) Notice: Subject to any disclaimer, the term of this patent is extended or adjusted under 35 U.S.C. 154(b) by 112 days.

(21) Appl. No.: 13/723,413

(22) Filed: Dec. 21, 2012

(65) Prior Publication Data

US 2014/0175372 A1   Jun. 26, 2014

(51) Int. Cl.

| | |
|---|---|
| *H01L 29/06* | (2006.01) |
| *H01L 31/0224* | (2006.01) |
| *H01L 33/38* | (2010.01) |
| *H01L 33/42* | (2010.01) |
| *H01L 33/16* | (2010.01) |
| *H01L 27/15* | (2006.01) |

(52) U.S. Cl.
CPC ........ *H01L 31/022466* (2013.01); *H01L 33/38* (2013.01); *H01L 33/42* (2013.01); *H01L 27/15* (2013.01); *H01L 33/16* (2013.01); *H01L 33/385* (2013.01); *H01L 2924/0002* (2013.01); *Y10S 977/932* (2013.01)

(58) Field of Classification Search
None
See application file for complete search history.

(56) References Cited

U.S. PATENT DOCUMENTS

| | | | |
|---|---|---|---|
| 2004/0157354 A1 | 8/2004 | Kuriyama et al. | |
| 2008/0315430 A1* | 12/2008 | Weber et al. | 257/774 |
| 2009/0057839 A1* | 3/2009 | Lewis et al. | 257/618 |
| 2009/0146142 A1* | 6/2009 | Kim et al. | 257/43 |

FOREIGN PATENT DOCUMENTS

| | | | |
|---|---|---|---|
| EP | 1703569 A2 | 9/2006 | |
| EP | 1804286 A1 | 7/2007 | |
| WO | WO 2010120233 A2 * | 10/2010 | .......... H01L 31/0352 |
| WO | WO 2011/078780 A1 | 6/2011 | |
| WO | WO 2011/142717 A1 | 11/2011 | |
| WO | WO 2012/035243 A1 | 3/2012 | |

OTHER PUBLICATIONS

Anttu et al., "Coupling of Light into Nanowire Arrays and Subsequent Absorption," J. Nanosci. Nanotechnol., vol. 10, pp. 7183-7187, 2010.
Wallentin et al., "InP Nanowire Array Solar Cells Achieving 13.8% Efficiency by Exceeding the Ray Optics Limit," www.sciencemag.org, Science.1230969, pp. 1-5, Jan. 2013.
International Search Report and Written Opinion received in connection with international application No. PCT/IB2013/003176; mailed Jun. 24, 2014.

* cited by examiner

*Primary Examiner* — Andres Munoz
(74) *Attorney, Agent, or Firm* — The Marbury Law Group PLLC

(57) ABSTRACT

A semiconductor nanowire device includes at least one semiconductor nanowire having a bottom surface and a top surface, an insulating material which surrounds the semiconductor nanowire, and an electrode ohmically contacting the top surface of the semiconductor nanowire. A contact of the electrode to the semiconductor material of the semiconductor nanowire is dominated by the contact to the top surface of the semiconductor nanowire.

11 Claims, 11 Drawing Sheets

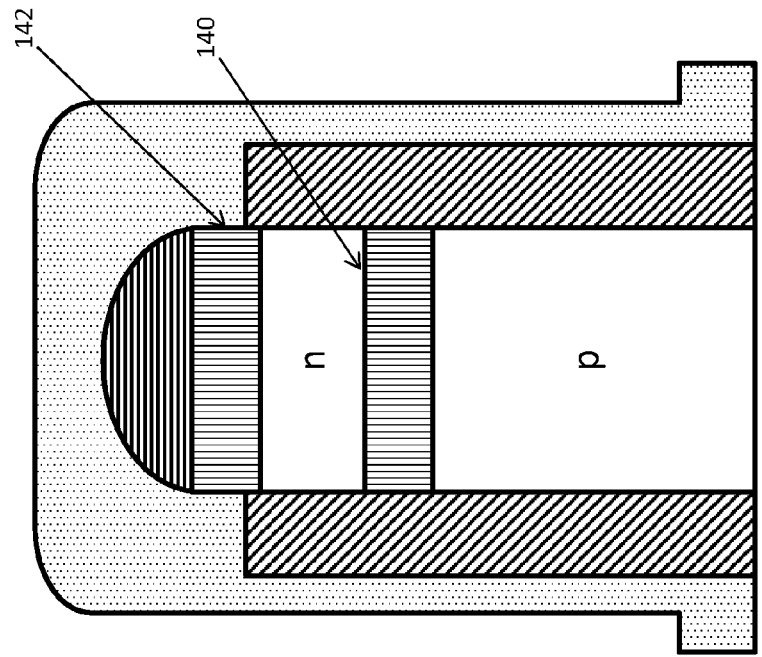
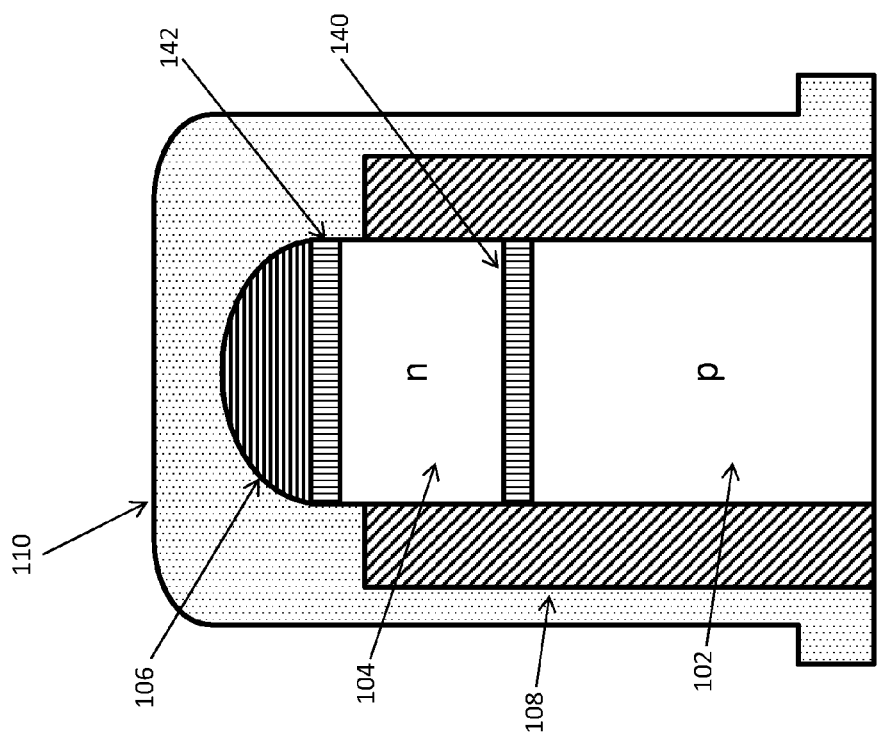
Fig. 2a
PRIOR ART
Fig. 2b
PRIOR ART

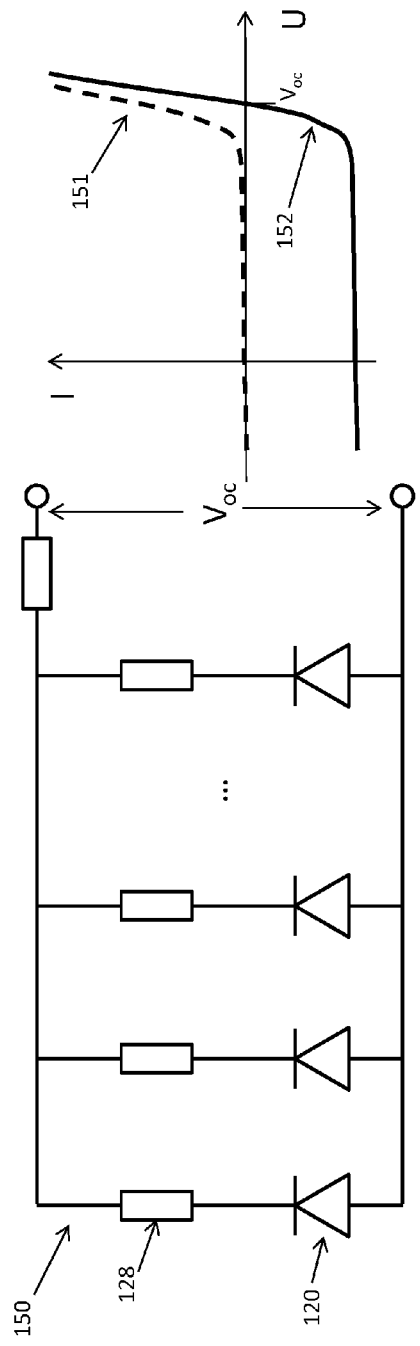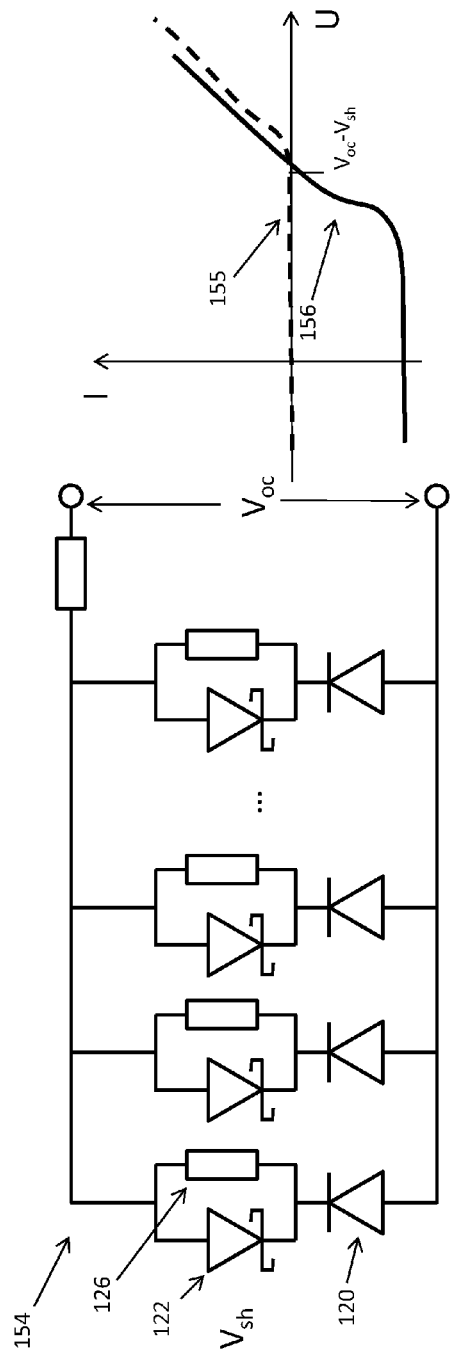

Fill factor 2 % increase $J_{sc}$ 16 % increase

Efficiency 67 % increase $V_{oc}$ 42 % increase

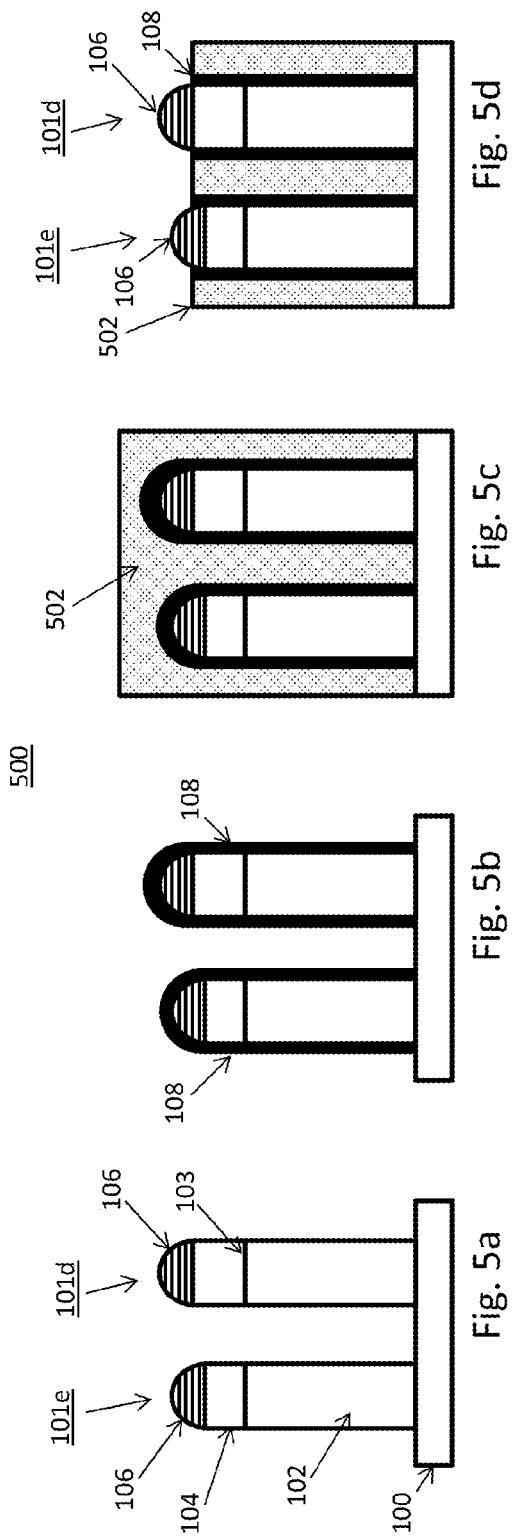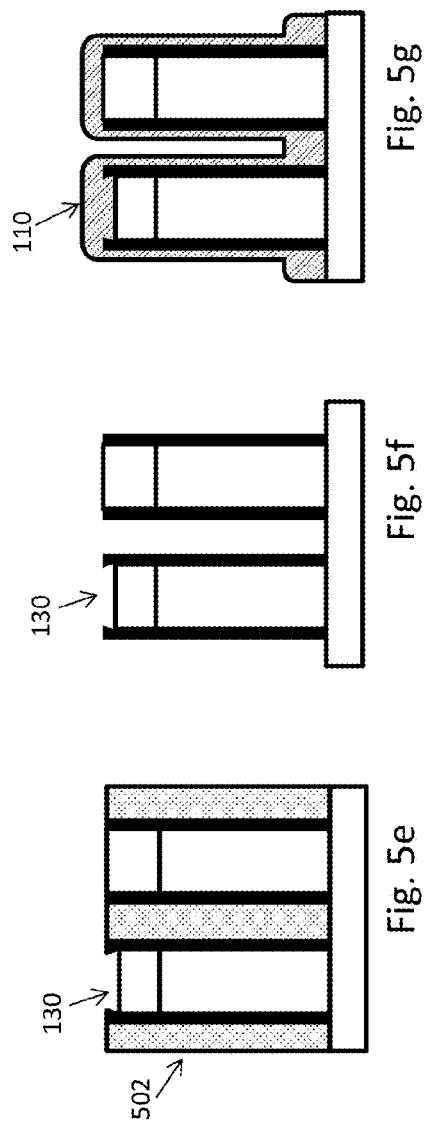

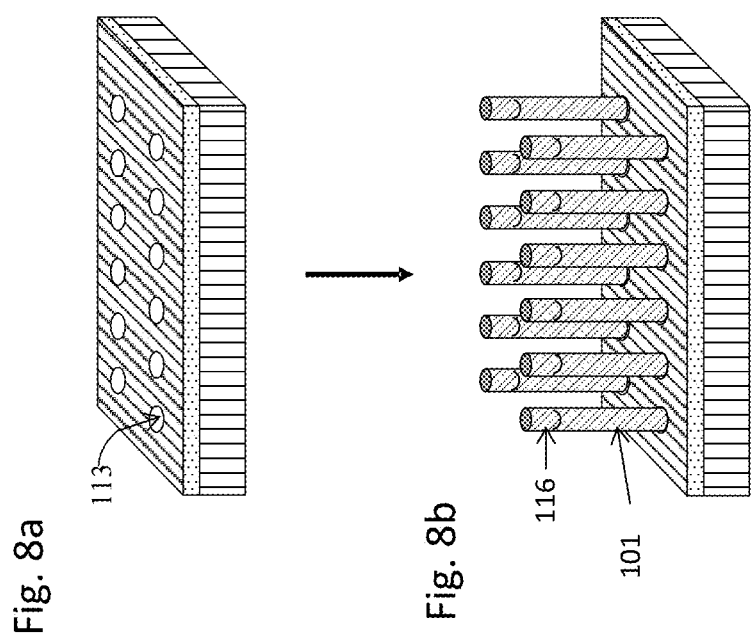

RECESSED CONTACT TO
SEMICONDUCTOR NANOWIRES

FIELD

The present invention relates to semiconductor devices and in particular to nanowire semiconductor devices.

BACKGROUND

Conventionally, electrical contacts for axial nanowire devices are made by encapsulating the nanowires in an insulator and then etching the insulator to expose the tops of each wire. A conducting material is then deposited to make the electrical contacts to the nanowires.

The present inventors observed that 1×1 mm² prior art InP nanowire solar cells have an average open circuit voltage, $V_{oc}$, which is significantly lower (500-700 mV) than what would be expected from an ideal InP solar cell (900 mV). In addition to the lower average $V_{oc}$ of the nanowire solar cells, the spread in $V_{oc}$ is typically large, with a standard deviation of several 100 mV. Thus, nanowire solar cells with a higher open circuit voltage and a small spread in open circuit voltage are desired.

SUMMARY

An embodiment relates to a semiconductor nanowire device which includes at least one semiconductor nanowire having a bottom surface and a top surface, an insulating material which surrounds the semiconductor nanowire, and an electrode ohmically contacting the top surface of the semiconductor nanowire. A contact of the electrode to the semiconductor material of the semiconductor nanowire is dominated by the contact to the top surface of the semiconductor nanowire.

Another embodiment relates to semiconductor nanowire device comprising at least one semiconductor nanowire having a bottom surface and a top surface, an insulating material which surrounds the semiconductor nanowire and extends above the top surface of the nanowire to create a recess between a sidewall of the insulating material and the top surface of the nanowire, and an electrode filling the recess and ohmically contacting the top surface of the nanowire.

Another embodiment relates to a method of making a semiconductor nanowire device, comprising forming at least one semiconductor nanowire, the semiconductor nanowire having a catalyst particle on a top surface of the semiconductor nanowire or a sacrificial portion comprising the top surface, forming an insulating material around the semiconductor nanowire, removing the catalyst particle or the sacrificial portion to recess the top surface of the nanowire below a top surface of the insulating material, and forming an electrode in ohmic contact with the top surface of the nanowire.

BRIEF DESCRIPTION OF THE DRAWINGS

FIGS. 2a-2b are schematic diagrams illustrating (a) the depletion regions of a nanowire of FIG. 1a under low bias/low illumination conditions and (b) the depletion regions of a nanowire of FIG. 1a under high bias/high illumination conditions.

FIGS. 3a-3d are (a) a circuit diagram of a nanowire device with nanowires of FIG. 1b or 1d connected in parallel, (b) a current versus voltage plot of the circuit of FIG. 3a, (c) a circuit diagram of a nanowire device with nanowires of FIG. 1a or 1c connected in parallel and (d) a current versus voltage plot of the circuit of FIG. 3c.

FIGS. 5a-5g are schematic diagrams illustrating a method of making a nanowire device according to an embodiment.

FIGS. 8a-8b are schematic diagrams illustrating a method of making a nanowire device according to an alternative embodiment.

DETAILED DESCRIPTION

For the purposes of this application, nanowires are nanoscale structures that have a diameter (for cylindrical nanowires) or width (for non-cylindrical nanowires, such as nanowires having a hexagonal cross sectional shape in a plane perpendicular to its axis) less than 1 micron, such as 2-500 nm such as 100-300 nm. The length, however, may be at least 0.5 microns, such as 0.5 to 3 microns, such as 1 to 2 microns.

Efficient solar cells made from Group IV or III-V materials, such as but not limited to Si, InP and GaAs, have the pn-junction very close to the top surface. Preferably, the pn-junction is on the order of only a few 100 nm from the top of the surface. This is also true for semiconductor nanowire devices. Both modeling and experiment indicate that the most efficient semiconductor nanowire solar cells have a wire diameter of at least 180 nm. Thus, from a contacting perspective, the semiconductor nanowire may be viewed as a small piece of planar material.

To make optoelectric devices from arrays of semiconductor nanowires, such as LEDs or solar cells, the top contact preferably incorporates a transparent conducting oxide (TCO). The contact between the TCO and the active device preferably has as low resistance as possible, and is preferably ohmic. In the case of solar cells, it is also preferable that the contact itself not be optically active, i.e., the contact should not subtract from the open circuit voltage ($V_{oc}$) of the device.

In the case of semiconductor nanowires grown from metal catalysts, such as Au, the conventional wisdom is that the Au seed particle is advantageous for forming an ohmic contact to the nanowires. Therefore, the Au particle is typically not removed, especially since removal would require additional processing steps. However, metal catalyst seed particles are known to reduce efficiency because of light shading. In addition to light shading and in contrast to conventional wisdom, an integrated metal particle may also provide poor electrical contact. Au has been found to make a Schottky-type contact to III-V semiconductors. The Schottky-type contact shows up in the current-voltage characteristics as a reverse diode in addition to any diode that may exist in the semiconductor nanowire. Therefore, the total device typically includes the semiconductor nanowire diode in series with a reverse Schottky diode as illustrated in FIG. 1a and discussed in more detail below.

Figures 1A, 1B:
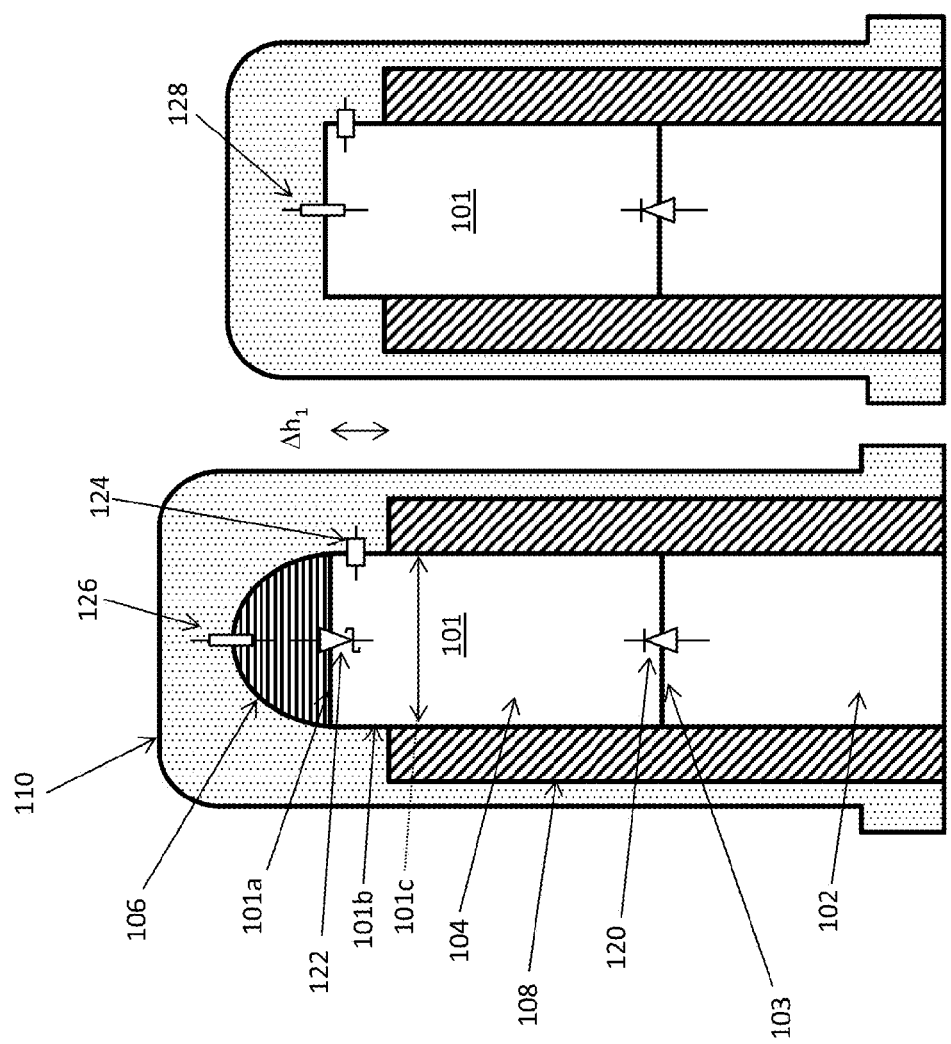
FIGS. 1a-1d are schematic diagrams illustrating (a) a prior art nanowire with a catalyst particle on top, partially covered with an insulator and fully covered with a transparent electrode, (b) a nanowire without a catalyst particle on top, partially covered with an insulator and fully covered with a transparent electrode, (c) a prior art nanowire with a catalyst particle on top, the full length of the nanowire and part of the catalyst particle covered with an insulator and fully covered with a transparent electrode and (d) a nanowire without a catalyst particle on top, the insulator extending beyond the top of the nanowire and fully covered with a transparent electrode.

FIGS. 1a and 1b illustrate nanowire devices of the prior art and of the first embodiment of the invention, respectively. As illustrated in FIG. 1a, the prior art semiconductor nanowire 101 is an axial nanowire which includes a first portion 102 having a first conductivity type (e.g., p-type or n-type) and a second portion 104 having a second conductivity type (e.g., n-type or p-type) different from the first conductivity type. A pn junction 103 is formed at the interface between the first portion 102 and the second portion 104 of the semiconductor nanowire 101. The pn junction 103 has the electrical characteristics of a diode as indicated by the diode symbol 120 in the figure. If desired, the nanowire may comprise a p-i-n junction device in which the junction region 103 comprises an intrinsic semiconductor or semiconductor of the first or second conductivity type that has a dopant concentration that is at least an order of magnitude lower than that of regions 102 and 104.

Additionally, an insulating or dielectric layer surrounds at least a portion of the sidewalls of the semiconductor nanowire 101, thereby forming an insulating shell 108 around the semiconductor nanowire 101. In an embodiment, the insulating shell 108 is made of a transparent material, such as $SiO_2$. If the semiconductor nanowire 101 is grown by the VLS process, or another process using metal catalyst particles, such as the Aerotaxy™ process (as described in PCT Published Application WO 11/142,717 (the '717 publication), assigned to Qunano AB and hereby incorporated by reference in its entirety), the metal catalyst particle 106 is located on top of the second portion 104 of the semiconductor nanowire 101.

As discussed above, a reverse Schottky diode 122 may be formed between the metal catalyst particle 106 and the second portion 104 of the semiconductor nanowire 101. The TCO electrode 110 encapsulates the semiconductor nanowire 101, including the insulating shell 108. In those portions of the semiconductor nanowire 101 that are not covered by the insulating shell 108, direct contact may be made between the TCO electrode 110 and the semiconductor nanowire 101. This contact is typically ohmic as illustrated by symbol 124. An additional ohmic contact may be formed between the metal catalyst particle 106 and the TCO electrode 110 as indicated by symbol 126. The ohmic contact connection 124 is in parallel with the gold particle-nanowire Schottky connection 122. Alternatively, this contact may form another Schottky diode with different electrical characteristics from the diode 120 or the reverse Schottky diode 122.

FIGS. 2a and 2b schematically illustrate depletion regions 140, 142 of a nanowire of FIG. 1a under low bias/low illumination conditions (FIG. 2a) and the depletion regions of a nanowire of FIG. 1a under high bias/high illumination conditions (FIG. 2b). As illustrated in FIG. 2a, a first depletion region 140 is formed at the pn junction 103 in the semiconductor nanowire 101. A second depletion region 142 is formed due to the reverse Schottky diode 122. That is, the reverse Schottky diode 122 induces a depletion region 142 in an upper portion of the semiconductor nanowire 101. Further, as illustrated in FIG. 2b, the thickness of the depletions regions 140, 142 varies with the applied voltage and/or illumination. Thus, the reverse Schottky 122 diode may influence the contact on the nanowire side, making the contact dependent not only on process variations (e.g., $\Delta h_1$) but possibly also on external forces.

FIG. 1b illustrates an embodiment in which the metal catalyst particle 106 is removed prior to depositing the TCO electrode 110. In this embodiment, an ohmic contact 128 is formed between the top surface of the semiconductor nanowire 101 and the TCO electrode 110 rather than the reverse Schottky diode 122 formed in the semiconductor nanowire 101 illustrated FIG. 1a. The height between the top of the insulating shell 108 and the top surface 101a of the semiconductor nanowire 101 is $\Delta h_1$, where $\Delta h_1$ indicates the typical process variation for the length of the exposed length of nanowire tip.

In one aspect of the first embodiment, the semiconductor nanowire 101 has a diameter or width and the TCO electrode 110 contacts a side portion 101b of the semiconductor nanowire 101 below the top surface 101a such that the length $\Delta h_1$ of the side portion 101b is less than the diameter/width 101c of the semiconductor nanowire 101. For example, diameter/width 101c may be 10% to 500% greater, such as 50-100% greater than the length $\Delta h_1$ of the side portion 101b. In another aspect of the first embodiment, $\Delta h_1$ equals to zero and no side portion of the nanowire is exposed by the shell 108, such that the nanowire and the shell have about the same height. In this configuration, the electrode 110 contacts only (exclusively) the top surface 101a of the nanowire but not the side portion 101b of the nanowire.

Thus, in the first embodiment, the electrode 110 contact to the semiconductor material of the nanowire is dominated by the contact to the top surface 101a where $\Delta h_1$ is less than a diameter or width 101c of the top surface 101a of the nanowire 101 (i.e., where $\Delta h_1=0$, or $0<\Delta h_1<101c$ in the first embodiment).

To allow for process variations, including uneven nanowire height, a longer side portion 101b of the nanowire is exposed than would otherwise be necessary so as not to accidentally leave some nanowires uncontacted. Thus, when the top electrical contact/electrode 110 is formed, varying portions of the nanowire tips make contact with the electrode 101. That is, the top electrode 110 is formed along longer side portions 101b in the longer nanowires than in the shorter nanowires (where $\Delta h_1$ may equal to zero in shorter nanowires and the electrode 110 only contacts the top surface 101a). The difference in the contact area between longer and shorter nanowires to the electrode 110 leads to undesirable non-uniformity in output and performance between different nanowires in the same device.

Figures 1C, 1D:
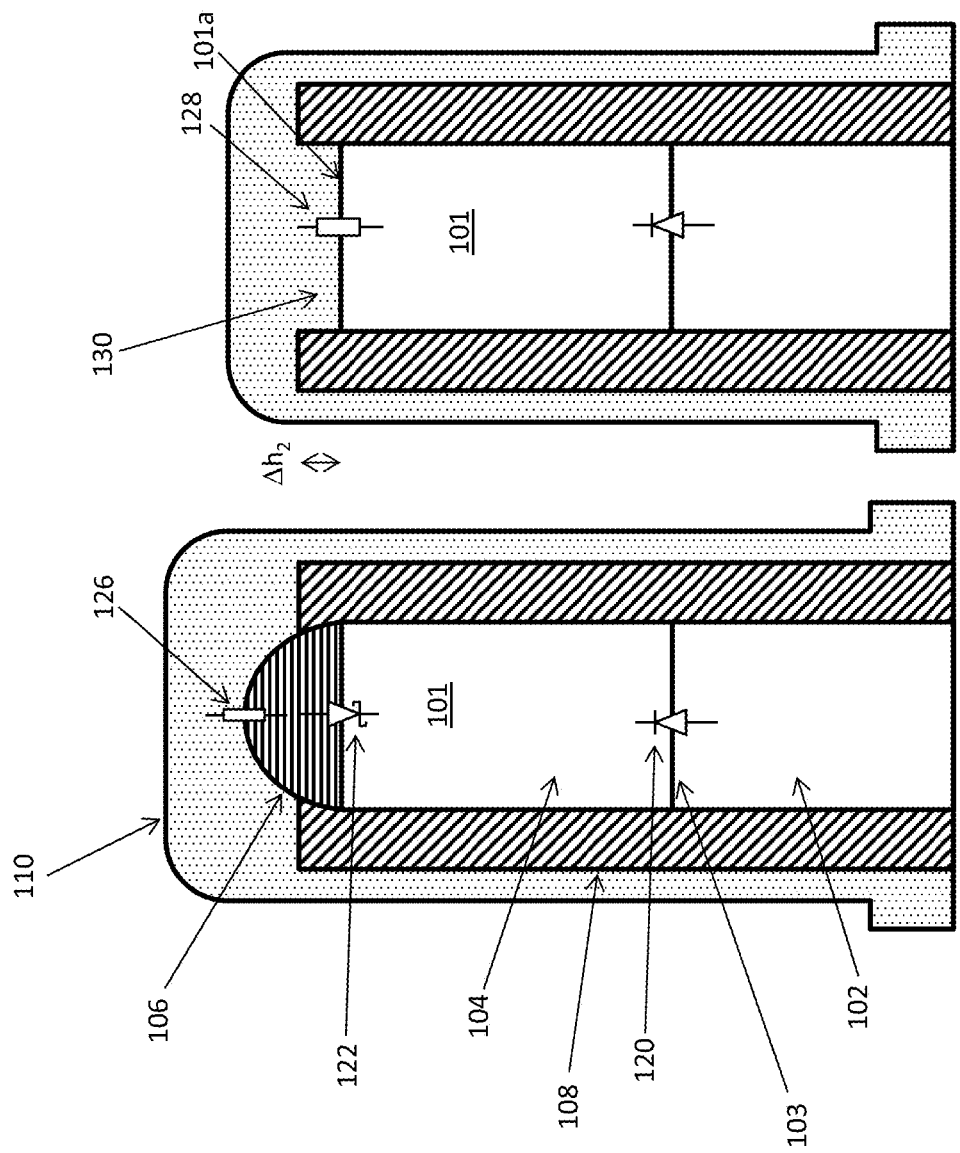

FIGS. 1c and 1d illustrate a prior art nanowire device and a nanowire device of a second embodiment, respectively. The second embodiment device is similar to the first embodiment device illustrated in FIG. 1b. However, in the second embodiment, the insulating shell 108 fully covers the sidewalls of the semiconductor nanowire 101. Further, the height of the insulating shell 108 typically exceeds the length of the semiconductor nanowire 101 by a height $\Delta h_1$, where $\Delta h_2$ is the distance from the top surface of the semiconductor nanowire 101 to the top surface of the insulating shell 108. In contrast to the first embodiment, the top electrode 110 contacts only the top surface 101a of the nanowire, and thus, the contact area between the nanowire surface and the top electrode is substantially identical (e.g., depends essentially on variation in nanowire cross section and varies by less than 40%, for example less than 20%, such as less than 10%, including less than 5%) for all nanowires on the same support (e.g., growth substrate or another support as will be described in more detail below), regardless of the nanowire height or variation in $\Delta h_2$ between different nanowires. As illustrated in FIG. 1d, when the catalyst nanoparticle 106 is removed from the top of the semiconductor nanowire 101, the excess insulating shell 108 above the nanowire 103 forms a recess 130 above the nanowire 103. When the TCO electrode 110 is formed, the recess is filled with electrode 110 TCO material.

Thus, the electrode contact with the nanowires 101 is preferably made only to the top surface of each semiconductor nanowire 101, or with as little as possible contact to the side of the semiconductor nanowire 101, as described above. Further, a benefit of allowing the insulating shell 108 to extend above the top end of the semiconductor nanowire 101 in the final device structure reduces the influence of process variations either due to varying nanowire length or to other process variations. The structure illustrated in FIG. 1d is achieved by incorporating a metal catalyst particle 106, which is removed during processing. In an alternative embodiment, an insulating shell 108 extending above the top end of the semiconductor nanowire 101 may also be used in core-shell nanowires.

As illustrated in FIGS. 3a-3d, multiple nanowires 101 may be connected in parallel to form a nanowire device, such as an optoelectric device, e.g., light emitting diode (LED) or solar cell. Specifically, FIG. 3a illustrates a circuit diagram 150 of devices with the nanowires 101 without catalyst particles 106 of the embodiments of FIGS. 1b/1d. FIG. 3c illustrates a circuit diagram 154 of prior art devices with the nanowires 101 having the catalyst particles 106 of FIGS. 1a/1c. FIG. 3b illustrates the simulated current versus voltage characteristic of the circuit of FIG. 3a while FIG. 3d and illustrates the simulated current versus voltage characteristic of the circuit of FIG. 3c.

Specifically, FIG. 3b illustrates the I-V characteristics of circuit 150 operated as a diode (e.g., LED) 151 and as a solar cell 152. FIG. 3d illustrates the I-V characteristics of circuit 154 operated as a diode 155 and as a solar cell 156. As indicated in FIG. 3c, the reverse Schottky diode 122 results in the generation of a shunt voltage $V_{sh}$ (a reverse voltage generated under illumination) for each semiconductor nanowire 101 having a catalyst nanoparticle 106 in the circuit 154. Further, as illustrated in FIG. 3d, the shunt voltage $V_{sh}$ distorts the I-V characteristics of the device 154 relative to the device 150, resulting in the I-V curves 155 and 156 crossing where the difference between the open circuit voltage $V_{oc}$ (the voltage generated under illumination without a load attached) and the shunt voltage $V_{sh}$ is zero. That is, the shunt voltage $V_{sh}$ reduces the open circuit voltage $V_{oc}$. In contrast, the curves 151, 152 of the circuit 150 of the embodiments of the invention shown in FIGS. 3a and 3b show an improved device behavior and $V_{oc}$.

Experimental results from 1×1 mm$^2$ InP nanowire solar cells show that when Au catalyst particles 106 are present on the nanowires 101, the average $V_{oc}$ is significantly lower (500-700 mV) than that of standard planar InP solar cells (880 mV). In addition to the lower average $V_{oc}$, the spread in $V_{oc}$ is typically large, with a standard deviation of several 100 mV.

Figure 4B:
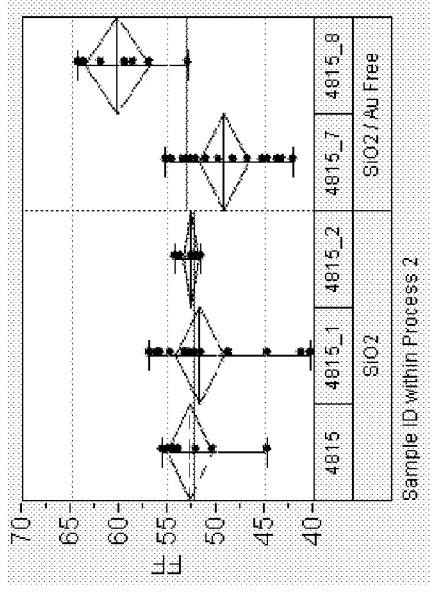
FIGS. 4a-4d are plots illustrating the increase in (a) efficiency, (b) fill factor, (c) open circuit voltage and (d) current density of embodiments versus conventional nanowire devices.
Figure 4D:
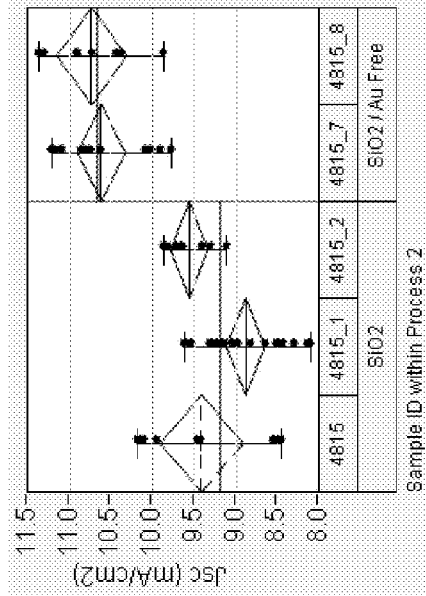
Figure 4A:
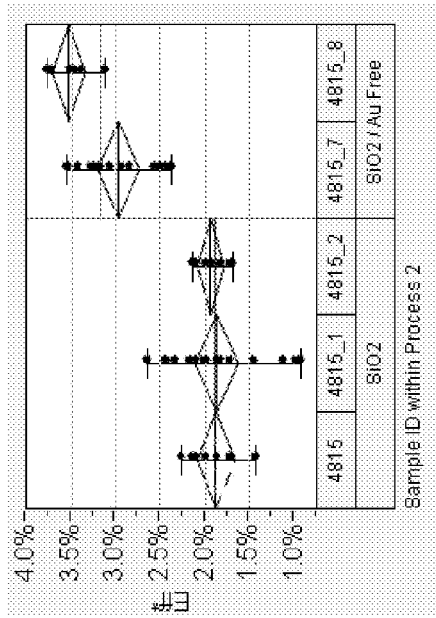
Figure 4C:
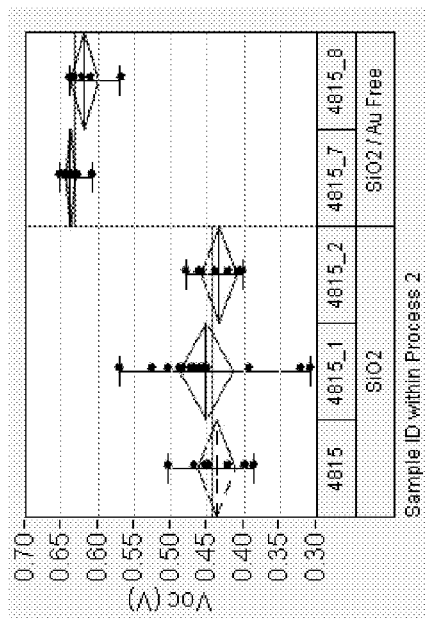

FIGS. 4a-4d illustrate experimental results comparing nanowire devices with and without metal catalyst nanoparticles 106 on the tops of the nanowires 101. FIG. 4a illustrates the increase in efficiency (e.g., >60%, such as 67% improvement) of nanowire devices with the catalyst nanoparticle 106 removed from the semiconductor nanowire 101. FIG. 4b illustrates the improvement in fill factor (2%). FIG. 4c illustrates the improvement in open circuit voltage (e.g., >40%, such as 42% improvement). FIG. 4d illustrates the improvement in current density (e.g., >10%, such as 16% improvement) of embodiments versus conventional nanowire devices. FIGS. 4a-4d show measurements on individual devices, each containing 4 million nanowires with silicon dioxide shells. The devices were processed identically, except for the Au particle removal step. The left three samples are with Au particle remaining, the right two are without Au particles.

Figure 7:
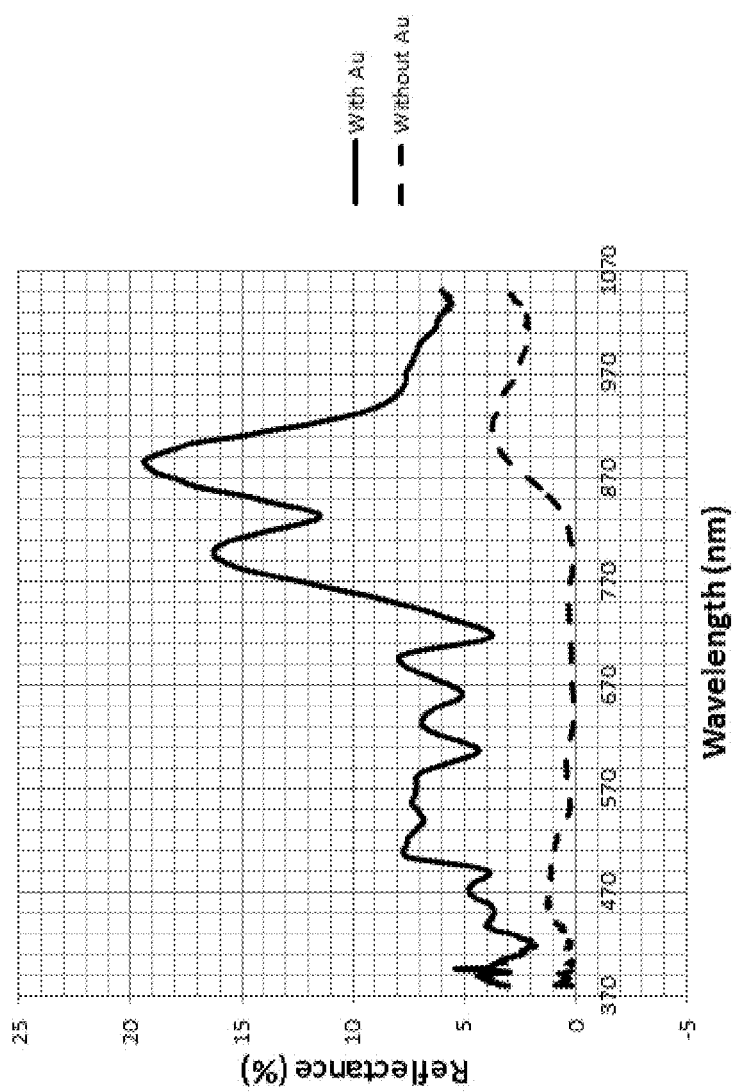
FIG. 7 is a plot of the reflectance as a function of wavelength comparing nanowires with and without gold catalyst particles on the tops of the nanowires.

The main contribution to the improvement in efficiency is believed to be due to the higher $V_{oc}$, where the device of the embodiments also exhibits a smaller spread $V_{oc}$, indicating a more homogeneous contact. A second source of improvement is the improvement in the short circuit current $J_{sc}$. This improvement is expected due to the lower shading and reflectivity of the device, illustrated in FIG. 7. As illustrated in FIG. 7, nanowires with catalyst particles 106 removed exhibit little or no reflectance over a wavelength range of 370-1170 nm. In contrast, nanowires 101 in which the nanoparticles 106 are not removed exhibit 5%-20% reflectance over almost the entire wavelength range.

FIGS. 5a-5g illustrate a method of making nanowire devices according to an embodiment. As illustrated in FIG. 5a, nanowires 101d, 101e are grown or deposited on a support 100, such as a substrate or another support as will be discussed below. For example, the nanowires may be grown on a semiconductor substrate 100 using a VLS method and a catalyst nanoparticle.

Alternatively, as-grown nanowires may be deposited on the support as follows. The nanowires are grown in the gas or vapor phase using the catalyst nanoparticles by the Aerotaxy™ process (as described in the above noted PCT Published Application WO 11/142,717). The collected nanowires are then positioned on the support 100, such as a semiconductor, conductive (e.g. metal) or insulating (e.g., glass, ceramic or plastic) substrate. The nanowires may be aligned with their axes substantially perpendicular to the top surface of the underlying support by any suitable method.

For example, the nanowires may be aligned by selective chemical functionalization. Specifically, the method includes selectively functionalizing portions (e.g., first portions 102) of the nanowires 101 with a charged organic functionalizing compound, dispersing the plurality of nanowires in a polar or semi-polar solvent, and aligning the nanowires 101 on a support 100 such that longitudinal axes of the nanowires are oriented substantially perpendicular to a major surface of the support. The major surface of the support 100 may also be functionalized with an organic attachment ligand which forms a binding pair with the functionalizing compound, typically by forming a covalent bond. That is, the functionalizing compound covalently binds to the attachment ligand to fix the plurality of nanowires to the support.

Alternatively, the nanowires may be aligned by applying an electric field over the population of nanowires, whereby an electric polarization in the nanowires makes them align along the electrical field, as described in PCT Published Application WO 11/078,780 published on Jun. 30, 2011 and its U.S. national stage application Ser. No. 13/518,259, both of which are incorporated herein by reference in their entirety. Preferably the nanowires are dispersed in a fluid (gas or liquid) during the steps of providing and aligning over the support. In addition to the polarization to make the nanowires align in the electric field, an optional electric dipole may be induced in the pn junction containing nanowires to provide further directionality and to enhance the nanowire alignment by illuminating the nanowires with radiation (e.g., visible light) during alignment, effectively inducing an open circuit photo voltage between the ends of the nanowires.

Preferably, the nanowires 101d, 101e include a first portion 102 having a first conductivity type (e.g., p-type) and a second portion 104 having a second conductivity type (e.g., n-type). If desired, each portion may comprise two or more sub-regions. For example, the second portion may contain a heavily doped upper sub-region (e.g., n+) and a lower lighter or lightly doped lower sub-region (e.g., n or n−) adjacent to the pn junction 103. Each sub-region may be 75-150 nm in length (i.e., in a direction parallel to axis of nanowire).

If the lower sub-region is intrinsic, then the device includes a p-i-n junction instead of a pn junction 103. The pn junction 103 preferably extends parallel to a major surface of the support (e.g., substrate) 100 and perpendicular to the nanowire axis. The pn junction is preferably located within 300 nm of the top surface of the semiconductor nanowires 101d, 101e.

As illustrated in FIG. 5a, the nanowires 101d, 101e are formed with metal catalyst particles 106b. Further, as illustrated in FIG. 5a, the nanowires 101d, 101e have different lengths, representing the variability in nanowire length in actual nanowire devices. The nanowires may be Group IV nanowires (e.g., silicon) or Group III-V nanowires (e.g., InP or GaAs).

Next, as illustrated in FIG. 5b, an insulating shell 108 is formed over the surface of the nanowires 101d, 101e, including the nanoparticles 106. The insulating shell 108 may be made of any suitable insulating material, such as an oxide or nitride, such as silicon oxide or silicon nitride. Further, the insulating shell 108 may be formed by any suitable method, such as atomic layer deposition (ALD). In addition to electrically insulating adjacent nanowires 101d, 101e from each other, the insulating shell 108 preferably also passivates the surfaces of the nanowires 101d, 101e.

If the ALD process is used to form the insulating shell 108 and the insulating shell 108 is made of $SiO_2$, the precursors for ALD deposition may be Tris(tert-butoxy)silanol (TTBS) and Trimethylaluminum (TMAl). TTBS and TMAl may be pulsed into the reaction chamber containing the nanowire devices. Preferably, the reaction chamber is heated. The TTBS and TMAl chemisorb to the heated nanowires 101d, 101e and form a thin conformal layer of $SiO_2$. Excess precursor and ligands/molecules may be removed by purging the chamber with $N_2$. In an embodiment, the base pressure in the reaction chamber is 2 mTorr and the temperature is 255° C. In an embodiment, the ALD $SiO_2$ process is conducted by performing of 3 pulses of TTBS followed by 1 pulse of TMAl. This process may be repeated as desired to achieve the desired layer thickness. For example, the process may be repeated 20-24 times to get a desired thickness of 50 nm $SiO_2$ around the NWs. The number of pulses may be increased or decreased to produce thicker or thinner insulating shells 108.

In addition to the ALD process, other method of coating/passivating the nanowires may be used, such as spin-on-glass, plasma enhanced chemical vapor deposition (PECVD) or low pressure chemical vapor deposition (LPCVD), curing of tetraethyl orthosilicate (TEOS) and sputtering. In addition to $SiO_2$, other suitable insulating/passivating materials include polymers, such as benzocyclobutene (BCB), $Al_2O_3$ and $HfO_x$.

Next, as illustrated in FIG. 5c, an optional sacrificial layer 502 is deposited over and between the nanowires 101d, 101e. The sacrificial layer 502 may be any suitable material, such as a polymer or photoresist layer and may be formed by any suitable method, such as spin deposition.

Next, as shown in FIG. 5d, the sacrificial layer 502 is planarized by etching or polishing to expose the tips of the nanowires 101d, 101e. As illustrated in FIG. 5d, in an embodiment, etching is performed such that the metal catalyst particle 106 is fully exposed on the taller nanowires 101d. That is, etching is performed until the sacrificial layer 502 and the insulating shell 108 are lowered to the top surface of the taller semiconductor nanowire 101d. At this level, both the sacrificial layer 502 and the insulating shell 108 rise above the top surface of the shorter nanowires 101e.

To open up and expose the nanowire tips for contact formation, any suitable etching technique may be used, such as reactive ion etching (RIE). In an embodiment, RIE is performed with a gas mixture of $CF_4$, $CHF_3$ and Ar, at flow rates of 5-50 sccm, such as 20, 20 and 10 sccm, respectively. In an embodiment, RIE may be performed with a RF plasma power of 200-300 W, such as 250 W at a pressure of 200-400 mTorr, such as 300 mTorr. The highly anisotropic nature of the RIE results in preferential etching of the insulating shell 108 on top of the nanowires 101d, 101e. The RIE parameters may be varied as desired. In an alternative embodiment, wet etching is used instead of RIE. Wet etching may be used by controlling the etch rate and the thickness of the sacrificial layer 502.

Next, as shown in FIG. 5e, the metal catalyst particles 106 are removed from the nanowires 101d, 101e. For the shorter nanowires 101e, a recess 130 surrounded by the insulating shell 108 is formed on top of the nanowires 101e when the metal catalyst particles 106 is removed. In an embodiment, the metal catalyst particles 106 are removed by selective etching, such as by iodide-based etching. Iodide etching has been found advantageous when etching gold particles off InP nanowires. In an embodiment, the iodide etch includes the following steps:

Step 1: Soak $H_2SO_4:H_2O$ 1:25, for 10 s
Step 2: Soak $H_2O$ for 10 s
Step 3: $KI:I_2:H_2O$ 4 g:1 g:40 ml for 10 s
Step 4: Rinse in a $4^{th}$ beaker containing DI water for 10 s
Step 5: Rinse in a $5^{th}$ beaker containing DI water for 2 min
Step 5: Blow-dry sample with $N_2$ gun
Step 6: Repeat steps 1-5 until catalyst particle removed.

For GaAs nanowires, a cyanide-based etch may be used to remove the catalyst particles 106. In an embodiment, the cyanide etch includes the following steps:

Step 1: Premixed Zn and Potassium Cyanides (e.g., TFAC Gold etch):$H_2O$ 6.1 g:100 ml, for 10 min
Step 2: Soak $H_2O$ for 30 s
Step 3: Rinse $H_2O$ for 10 min
Step 4: Blow-dry sample with $N_2$ gun For nanowires grown from seed particles other than Au (e.g., Cu, Ag, Al, Fe, Ni, In, Ga, and their alloys, including alloys with Au) other etch chemistries may be used.

As illustrated in FIG. 5f, the remaining sacrificial layer 502 is removed after the metal catalyst particles 106 are removed from the nanowires 101d, 101e. If the sacrificial material is a polymer, the sacrificial material may be removed by soaking the device in an organic solvent, such as Remover 1165. Preferably, the nanowires 101d, 101e are then cleaned, such as with an $O_2$ RIE plasma to remove any organic residuals. In an embodiment, RIE is performed at a power of 40-60 W, such as 50 W, a pressure of 200-300 mTorr, such as 250 mTorr and an oxygen flow rate of 40-60 sccm, such as 50 sccm $O_2$.

Next, as illustrated in FIG. 5g, the top electrode 110 is formed over the nanowires 101d, 101e. Preferably, the top electrode 110 is made from a transparent material, such as a transparent conducting oxide (TCO). In an embodiment, the TCO layer is indium tin oxide (ITO) sputtered at room temperature. In an alternative embodiment, the TCO layer is Al-doped zinc oxide (AZO) formed by sputtering or ALD.

Figure 5H:
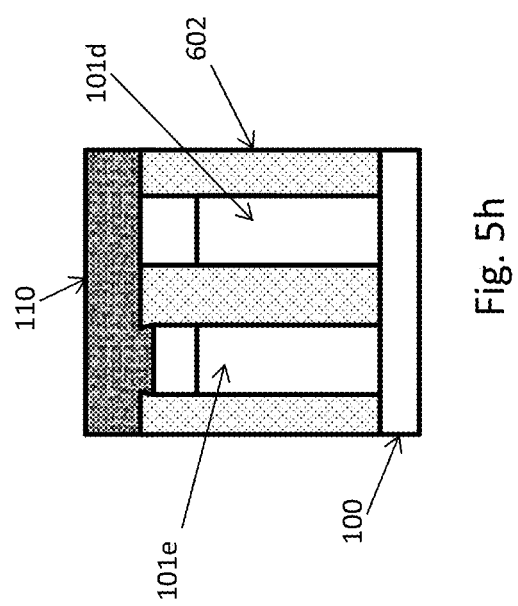
FIGS. 5h and 5i are schematic side cross sectional view diagrams illustrating nanowire devices made according to alternative embodiments.

In an alternative embodiment shown in FIG. 5h, the insulating shell 108 is omitted. In other words, the shell deposition step 108 shown in FIG. 5b is omitted. Instead of the optional sacrificial layer 502 illustrated in FIG. 5c, a permanent bulk insulating material layer 602 shown in FIG. 5h is formed between and over the nanowires 101d, 101e. Insulating material 602 may comprise any suitable insulating material, such as a polymer material, silicon oxide, silicon nitride, and other suitable materials.

The process then proceeds as described above with respect to FIGS. 5d and 5e, where the insulating layer 602 is planarized by etching or polishing to expose the tips of the nanowires 101d, 101e. The catalyst particles 106 are then removed as described above, and the top electrode 110 is formed over the exposed nanowires 101d, 101e and the insulating layer 602, as shown in FIG. 5h. Thus, the insulating layer 602 remains in the final device and is not removed like the sacrificial layer 502 in the removal step shown in FIG. 5f.

Figure 5I:
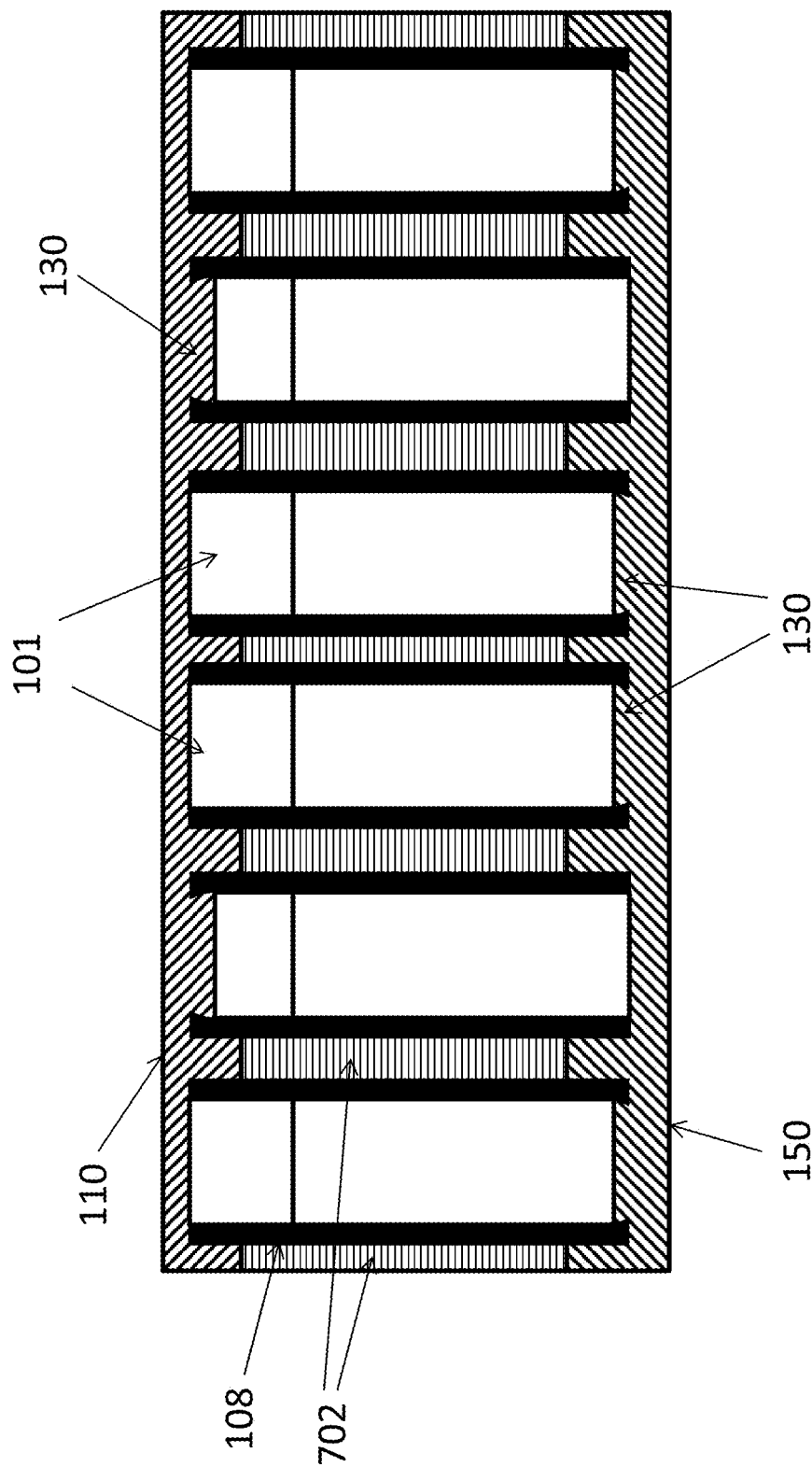

FIG. 5i illustrates another alternative embodiment. In this embodiment, the nanowires 101 are not located on a support 100 (i.e., the support at the bottom of the nanowires is omitted). Instead, the as grown nanowires 101 are embedded in an insulating matrix 702. For example, the nanowires 101 may be grown using the Aerotaxy™ process and then collected and embedded in an insulating matrix 702, such as a polymer matrix.

Optionally, both the top electrode 110 and the bottom electrode 510 contact to the nanowires 101 may be made using the method described above with respect to FIGS. 5b-5g. Thus, as shown in FIG. 5i, the nanowires 101 are exposed in both the top and bottom surfaces of the insulating matrix 702. At least some of the nanowires 101 are recessed with respect to either the top and/or bottom surface of their respective shell 108 to form recesses 130 on top and bottom of some of the nanowires 101. The top and bottom electrodes 110, 510 are then deposited over the respective top and bottom surfaces of the insulating matrix 702 to contact the exposed top and bottom surfaces of the nanowires 101. The bottom electrode 510 may comprise a metal substrate, a reflective mirror (e.g., a reflective metal layer) or a transparent contact (e.g., TCO). If desired, the shells 108 may also be omitted in this embodiment similar to the method described above with respect to FIG. 5h.

Figure 6B:
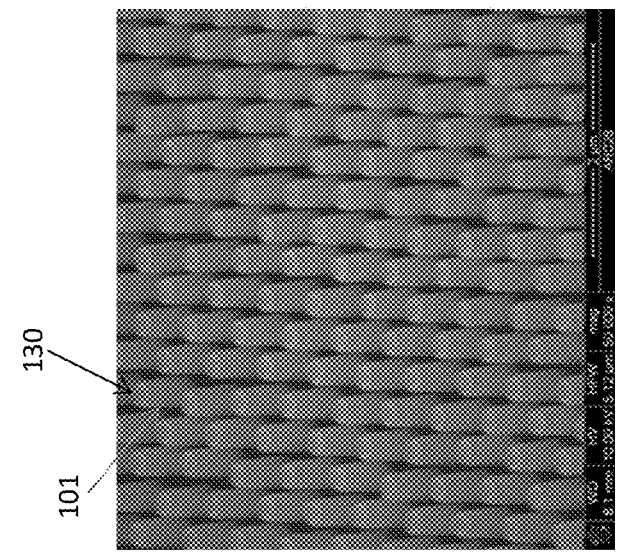
FIGS. 6a-6b are a scanning electron microscope (SEM) micrographs of (a) an array of nanowires with catalyst particles on top and (b) an array of nanowires with the catalyst particles removed, leaving recesses in the tops of the nanowires.
Figure 6A:
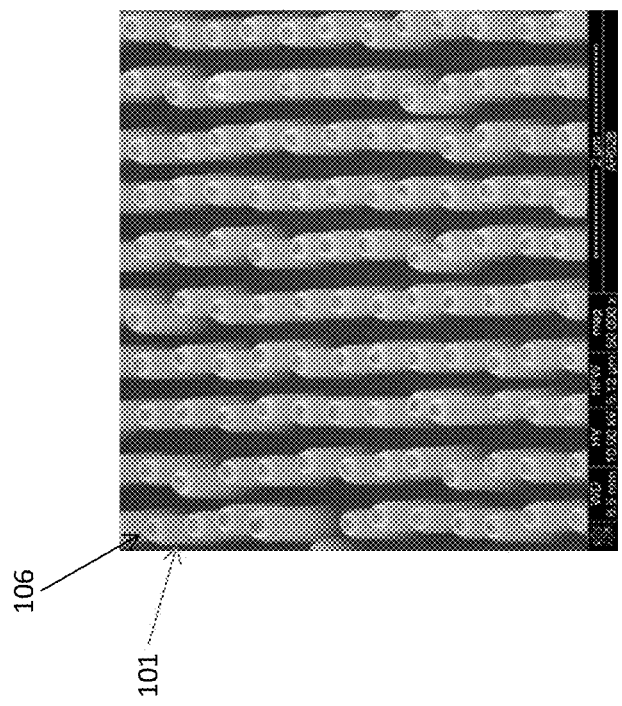

FIGS. 6a and 6b show SEM images of nanowires 101 before (a) and after (b) removal of the Au particles. The bright rim around the wires in FIG. 6b show that most of the wires have a recess 130 in the tip, like the nanowire schematically illustrated in FIG. 1d.

FIGS. 8a-b illustrate an alternative third embodiment in which the semiconductor nanowire 101 is grown without a catalyst. In this embodiment, a sacrificial portion 116 may be provided in an upper part of the second portion 104 of the semiconductor nanowire 101. For example, if the semiconductor nanowire 101 is made of GaAs, then the upper portion of the semiconductor nanowire 101 may be made of Si, AlGaAs or AlAs, which can be selectively etched with respect to GaAs.

As shown in FIG. 8a, the method begins by providing a growth mask 111 on a substrate 105. The substrate may be any substrate, such as GaAs or silicon, and the growth mask may be a dielectric such as of $SiN_x$ or $SiO_x$.

Then, openings 113 are formed in the growth mask 111. The openings are preferably well controlled, both in regards to their diameter and their relative positioning. Several techniques known in the art can be used for the procedure including, but not limited to lithography, such as electron beam lithography (EBL), nanoimprint lithography, optical lithography, followed by etching, such as reactive ion etching (RIE) or wet chemical etching methods. Preferably the openings have approximately the same diameter as the nanowire 101 diameter 101c (e.g., 500 nm or less), and pitched 0.5-5 µm apart. The openings define the position and the diameter 101c of the nanowires 101 to be produced.

Then, as shown in FIG. 8b, nanowire growth proceeds by a CVD based process wherein the precursor source flows are preferably continuous. The precursor source flow rates are adjusted to achieve a low supersaturation in the growth zone. The V/III-ratio should be in the range 1-100, preferably in the range 1-50, and even more preferably in the range 5-50. It should be noted that this V/III-ratio is considerably lower than the ratios used for film growth. The precursors are changed during the growth to form the sacrificial region 116 at the top of the nanowires 101. For example, Al or Al+Ga precursor (e.g., TMAl or TMG) is switched for Ga precursor during MOCVD nanowire growth to switch between AlGaAs or AlAs sacrificial semiconductor region 116 growth and the base GaAs nanowire regions 102, 104 growth. Similar steps may be used for Si, InP or other semiconductor material nanowires and sacrificial regions. Silicon nanowires may be grown by MOCVD using metal organic precursors or by conventional CVD using hydride sources, such as silane or disilane.

The process of the third embodiment then continues in the same manner as in FIGS. 5a-5g, except that the sacrificial region 116 instead of the catalyst particle 106 is located on the nanowires 101. Thus, a similar effect is obtained by using and removing the sacrificial region 116 as using and removing the catalyst particle 106. Thus, the nanowire of FIG. 1d may be formed using the method of FIGS. 8a-b followed by FIGS. 5a-5g.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A semiconductor nanowire device, comprising:
   a plurality of semiconductor nanowires having a bottom surface and a top surface;
   an insulating material which surrounds the plurality of semiconductor nanowires, wherein the insulating material comprises a plurality of discrete insulating shells, each insulating shell of the plurality of discrete insulating shells surrounds a respective semiconductor nanowire of the plurality of semiconductor nanowires; and
   an electrode ohmically contacting the top surface of the plurality of semiconductor nanowires, wherein a contact of the electrode to a semiconductor material of the plurality of semiconductor nanowires is dominated by the contact to the top surface of the plurality of semiconductor nanowires,
   wherein:
   each insulating shell of the plurality of discrete insulating shells is separated from adjacent insulating shells of the plurality of discrete insulating shells by the electrode;
   the insulating material extends above the top surface of at least one of the semiconductor nanowires of the plurality of semiconductor nanowires to create a recess between a sidewall of the insulating material and the top surface of the at least one semiconductor nanowire; and the electrode fills the recess and contacts only the top surface of the at least one semiconductor nanowire without contacting a sidewall of the at least one semiconductor nanowire.

2. The semiconductor nanowire device of claim 1, wherein the electrode and the top surface of the at least one semiconductor nanowire form an ohmic contact and the electrode extends over a top surface of the insulating material.

3. The semiconductor nanowire device of claim 1, wherein the electrode comprises a transparent material.

4. The semiconductor nanowire device of claim 3, wherein the electrode comprises a transparent conductive oxide.

5. The semiconductor nanowire device of claim 1, wherein a dielectric growth mask material is located between the plurality of semiconductor nanowires.

6. The semiconductor nanowire device of claim 5, wherein some of the plurality of semiconductor nanowires do not have a recess between the insulating material and their top surface.

7. The semiconductor nanowire device of claim 1, wherein:
the at least one semiconductor nanowire comprises a silicon or a III-V semiconductor; and
the at least one semiconductor nanowire is positioned on a bottom support or is embedded in an insulating matrix without the bottom support.

8. The semiconductor nanowire device of claim 1, wherein the at least one semiconductor nanowire is an axial nanowire having a pn junction with a first layer having a first conductivity type over a second layer having an opposite second conductivity type.

9. The semiconductor nanowire device of claim 8, wherein the pn junction extends perpendicular to an axis of the at least one semiconductor nanowire and the pn junction is located within 300 nm of the top surface of the at least one semiconductor nanowire.

10. The semiconductor nanowire device of claim 1, wherein the plurality of semiconductor nanowires do not comprise a catalyst particle located on the top surface.

11. The semiconductor nanowire device of claim 1, wherein the device is a light emitting diode device, an optoelectronic device or a photovoltaic device.

* * * * *